United States Patent
Golla-Schindler et al.

(10) Patent No.: US 6,815,678 B2
(45) Date of Patent: Nov. 9, 2004

(54) RASTER ELECTRON MICROSCOPE

(75) Inventors: Ute Golla-Schindler, Galen (DE); Bernd Schindler, Galen (DE)

(73) Assignee: LEO Elektronemikroskopie GmbH, Oberkochen (DE)

(*) Notice: Subject to any disclaimer, the term of this patent is extended or adjusted under 35 U.S.C. 154(b) by 0 days.

(21) Appl. No.: 10/389,907

(22) Filed: Mar. 18, 2003

(65) Prior Publication Data

US 2003/0230713 A1 Dec. 18, 2003

(30) Foreign Application Priority Data

Mar. 18, 2002 (DE) ........................................ 102 11 977

(51) Int. Cl.[7] ...................... H01J 37/244; H01J 37/256; H01J 37/26; H01J 49/46
(52) U.S. Cl. ........................ 250/310; 250/311; 250/305; 250/306; 250/307; 250/492.2; 250/505.1
(58) Field of Search ................................ 250/305–307, 250/309–311, 396 R, 396 ML, 397–400, 492.2, 505.1

(56) References Cited

U.S. PATENT DOCUMENTS

| | | | | |
|---|---|---|---|---|
| 4,812,652 A | * | 3/1989 | Egle et al. ................... | 250/311 |
| 6,384,412 B1 | * | 5/2002 | Krahl et al. ................. | 250/305 |
| 6,498,345 B1 | * | 12/2002 | Weimer et al. ............. | 250/310 |
| 2002/0088939 A1 | * | 7/2002 | Hayn ......................... | 250/310 |

FOREIGN PATENT DOCUMENTS

| | | |
|---|---|---|
| DE | 100 32 607 | 1/2002 |
| JP | 09167588 | 6/1997 |

OTHER PUBLICATIONS

"Contrast in the transmission mode of a low–voltage scanning electron microscope" by U. Golla et al, Journal of Microscopy, vol. 173, Pt. 3, Mar. 1994, pp. 219 to 225.

* cited by examiner

*Primary Examiner*—John R. Lee
*Assistant Examiner*—Bernard E. Souw
(74) *Attorney, Agent, or Firm*—Walter Ottesen

(57) ABSTRACT

The invention relates to a raster electron microscope having a specimen chamber and a detector for electrons mounted in the specimen chamber. The raster electron microscope also includes a specimen table having a specimen holder and the specimen table is mounted in the specimen chamber. A diaphragm system is provided on the specimen table and has a diaphragm between the specimen holder and the detector. The diaphragm system is adjustable relative to the specimen holder. The invention can be configured especially as an ancillary module which is accommodated on the specimen table of a conventional raster electron microscope. The system of raster electron microscope and ancillary unit serves for generating special contrastings, especially a dark-field contrast in transmission.

46 Claims, 3 Drawing Sheets

RASTER ELECTRON MICROSCOPE

BACKGROUND OF THE INVENTION

As a rule, raster electron microscopes include one or several detectors in the specimen chamber for detecting secondary electrons and/or back-scattered electrons. These secondary and back-scattered electrons are released from the specimen by the primary electron beam. A different contrasting of the specimen image is generated depending upon whether the intensity of the back-scattered electrons or the intensity of the secondary electrons is the basis for the image generation.

An arrangement is described in the article of U. Golla et al entitled "Contrast in the transmission mode of a low-voltage scanning electron microscope", Journal of Microscopy, Volume 173 (1999), pages 219 to 225, with which the image generation is possible on the basis of electrons transmitted through the specimen utilizing a conventional raster electron microscope. The arrangement includes a cylindrically-shaped shielding unit which is accommodated on the specimen table and the specimen holder is accommodated in the interior of the shielding unit. The shielding unit ensures that no electrons can reach the detector which exit from the specimen on the incident side of the electron beam. The shielding unit extends directly from the lower poleshoe of the objective lens of the raster electron microscope. The contrasting, which is possible with this arrangement, corresponds to the brightness field contrast in transmission and makes possible only the detection of signals of the central region of the specimen because the region from which electrons exiting the specimen can reach the detector is delimited by the diaphragm diameter.

The generation of images in the dark field contrast in electron microscopy is, up to now, restricted to the so-called raster transmission electron microscope (STEM). These STEMs are transmission electron microscopes having, as a rule, a multi-stage condenser system between the electron source and the specimen and an imaging system with which the specimen is imaged magnified into a detection plane. The imaging system is, as a rule, likewise a multi-stage electron optical imaging system. In the STEM mode, the condenser system is so driven that it images the electron source demagnified on the specimen.

In transmission electron microscopes, the specimen plane is usually at the elevation of the poleshoe gap of a condenser-objective-single-field lens which operates as the last condenser lens as well as an objective lens. For this reason, with transmission electron microscopes, no investigations with inclined specimens are possible wherein the specimen surface is inclined to the optical axis of the incident primary electron beam, that is, a surface normal of the specimen lies at an angle to the optical axis of 30° or more. Specimen inclinations of this kind are realizable up to now only in raster electron microscopes.

SUMMARY OF THE INVENTION

It is an object of the invention to provide a raster electron microscope with which the generation of specimen images in transmission is possible with different contrastings. It is another object to configure the invention in the form of an ancillary unit for raster electron microscopes wherein the ancillary unit is accommodated in the specimen chamber.

The raster electron microscope of the invention includes: an electron source for emitting electrons along a beam path toward a specimen; a specimen chamber mounted in the beam path; a detector mounted in the specimen chamber for detecting electrons; a specimen table mounted in the specimen chamber and having a specimen holder; a diaphragm system mounted on the specimen table and the diaphragm system being adjustable relative to the specimen holder; and, the diaphragm system including a diaphragm arranged between the specimen holder and the detector.

The raster electron microscope of the invention includes, as usual, a specimen chamber, and a detector for electrons as well as a specimen table having a specimen holder. The detector and specimen table are both mounted in the specimen chamber. A diaphragm system is accommodated on the specimen table and is adjustable relative to the specimen holder. The diaphragm system has a diaphragm between the specimen holder and the detector.

The contrasting of the recorded image can be changed with the aid of the diaphragm adjustable relative to the specimen holder. If the diaphragm is so designed and adjusted that the electrons are masked which run close to the optical axis of the raster electron microscope and are transmitted through the specimen, then only the electrons, which are scattered at larger angles, contribute to the image generation and the result corresponds to a dark-field contrast. This contrasting increases, for example, the contrast in specimens having Z-contrast or crystalline specimens having irregularities regarding the grating structure or specimens having phase transitions. If, on the other hand, the diaphragm is so configured and adjusted that just those electrons, which exit from the specimen close to the optical axis and only at a slight angle to the optical axis, transmit through the diaphragm and therefore contribute to the image generation, then this corresponds to the contrasting in a bright-field contrast.

Successive images of larger specimen regions or even of the entire specimen can be generated with the desired contrasting by displacing the specimen table including the shielding unit accommodated thereon, perpendicularly to the optical axis of the raster electron microscope and simultaneously shifting the diaphragm in the opposite direction.

The specimen holder is preferably mounted in a shielding unit and the diaphragm is accommodated on the base body at the side facing away from the specimen holder. The shielding unit ensures that only those electrons exiting the specimen can reach the detector which have passed the diaphragm opening. A corresponding shielding unit can be configured as a cylindrical tube impermeable to electrons. The cross-sectional form of the tube is of no consequence. The shielding body should have a ring on the side facing toward the objective. With this ring, the regions which follows directly upon the poleshoe of the objective is sealed against the exit of electrons. In this way, back-scattered electrons or secondary electrons, which exits from the specimen surface irradiated by the primary electron beam, cannot reach the detector.

The detector can be configured for the detection of secondary electrons and/or the detection of electrons which have an energy comparable to the energy of the primary electrons.

In a preferred embodiment, the detector includes a conversion element which emits secondary electrons having a yield of magnitude greater than 1 when irradiated with electrons. This conversion element is preferably mounted directly rearward of the diaphragm so that all electrons, which are transmitted through the diaphragm opening, are incident upon this conversion element.

The diaphragm system preferably has several diaphragms having different diaphragm openings which can be selectively introduced between the specimen holder and the detector. In this way, the nature of the contrasting can be easily changed. Especially preferable is a motor drive for the exchange of diaphragms so that no manual intervention in the specimen chamber is necessary. With adjustment paths of the drive for the diaphragm adjustment which are sufficiently long, these drives can, at the same time, be used for switching the diaphragms.

The diaphragms or one of the diaphragms should have a central region impermeable for electrons for the generation of dark-field contrast.

The specimen holder is preferably tiltable about an axis perpendicular to the optical axis of the raster electron microscope. Tilt angles of 30° and more should be possible between the surface normal of the specimen holder and the optical axis.

The invention can be especially configured as an ancillary unit for a raster electron microscope. Such an ancillary unit includes: a cylindrical shielding unit which is accommodated on a specimen table; a specimen holder mounted in the interior of the shielding unit; and, a diaphragm holder having a diaphragm. The diaphragm holder closes off the shielding unit on the side facing toward the specimen table and is adjustable relative to the specimen holder. The generation of dark-field contrast images in transmission is possible in a simple manner with conventional raster electron microscopes with the aid of such an ancillary unit and the controls required for the adjusting drives of the diaphragm holder.

In an alternative ancillary unit, a shielding unit surrounds the electron detector and the inlet opening of the shielding unit is closed by a diaphragm which can be exchanged. A specimen holder is then accommodated at the shielding unit and is adjustable relative to the diaphragm or relative to the diaphragm holder.

In a further advantageous embodiment, an energy filter is provided between the specimen holder and the diaphragm system or between the diaphragm system and the detector. In this way, it is additionally achieved that only electrons, which are transmitted through the specimen, can reach the detector with a specific energy so that an additional contrasting possibility results. A corresponding energy filter can, in the simplest case, be configured as a counter field electrode. Alternatively, it is also possible to utilize more complex magnetic or electrostatic energy filters or spectrometers as they are known from the state of the art.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
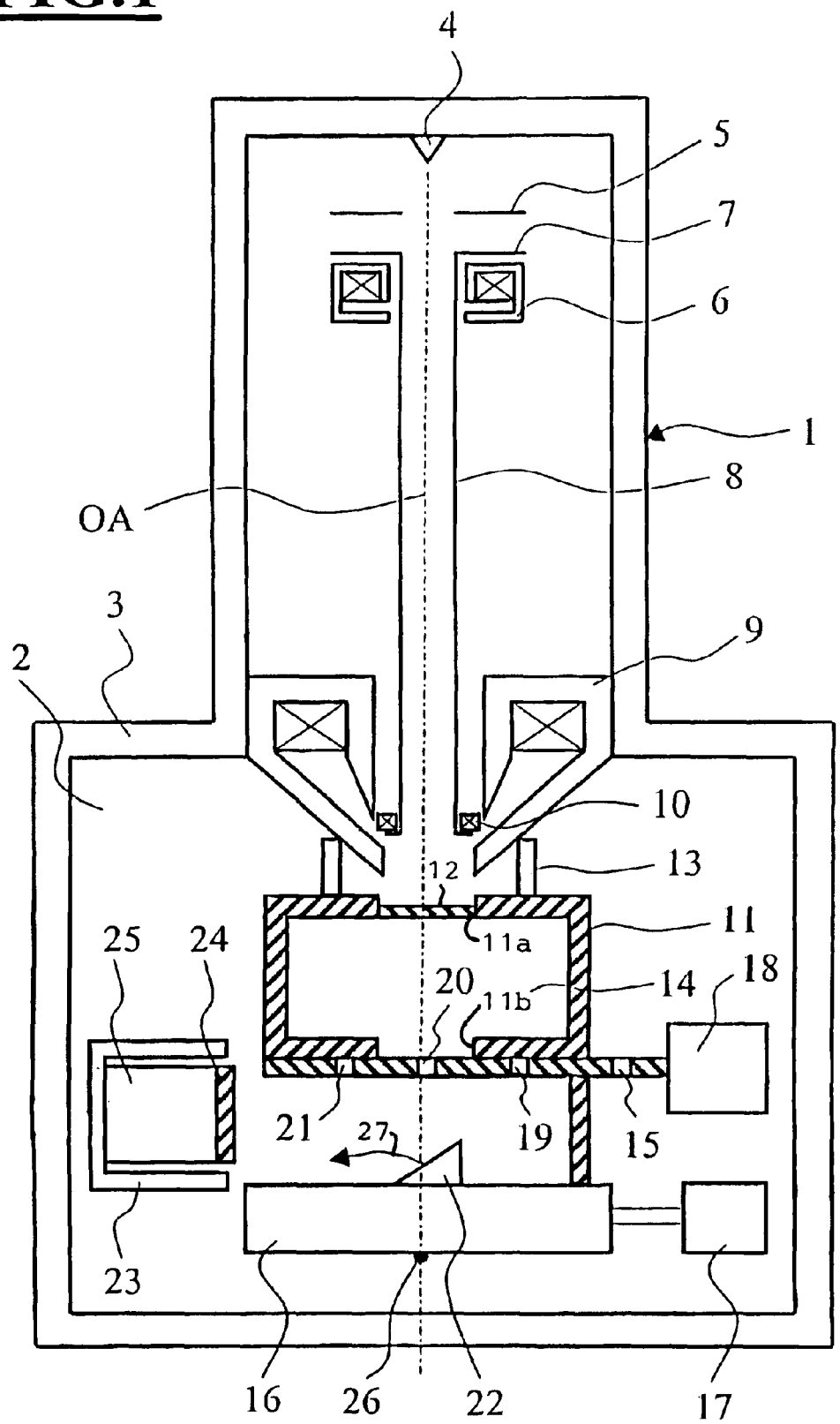
FIG. 1 is a schematic of a raster electron microscope in section.

In FIG. 1, reference numeral 1 identifies the column of a raster electron microscope having a specimen chamber 2. The raster electron microscope itself can be of conventional configuration and include the following: a cathode 4 which serves as an energy source; an extraction electrode 5 which follows the cathode 4; and an acceleration electrode 7 with which electrons, which are emitted from the cathode 4, are accelerated to their column energy.

A magnetic condenser lens 6 follows the electron beam generator and adjusts the aperture of the electron beam. An objective lens 9 is disposed downstream of the condenser lens 6. The objective lens 9 can be a purely magnetic lens having a coil and a poleshoe or it can be the combination of an electrostatic lens and a magnetic lens. In the illustrated embodiment, a beam guiding tube 8 is provided which reaches from the anode 7 along the optical axis OA to the elevation of the poleshoe gap of the objective lens 9 and, if required, is at a potential deviating from the specimen potential. In this way, an electrostatic lens is formed by the electrostatic deceleration field between the outlet from the beam guide column and the specimen. This electrostatic lens at least partially spatially superposes the lens action generated by the magnetic field of the objective lens.

The coils of a deflection system 10 are mounted at the elevation of the poleshoe gap of the objective lens 9. With the coils, the electron focus, which is generated by the objective lens 9, can be deflected perpendicularly to the optical axis OA for scanning the specimen.

An SEM specimen table 16 is mounted with the specimen chamber 2. The SEN specimen table 16 is motorically displaceable an the three spatial directions, that is, perpendicular as well as parallel to the optical axis OA, and is additionally tiltable about an axis 26 perpendicular to the optical axis OA and perpendicular to the plane of the drawing.

The ancillary unit of the invention is accommodated on the specimen table 16. The ancillary unit comprises a cylindrical base body 11 having a wide bellied interior space 14 and two openings (11a, 11b) arranged coaxially to each other as well as an opening at each end of the cylindrical base body 11. The opening 11a, which faces toward the objective 9, is provided with a specimen holder 12 as it is otherwise utilized as a specimen holder in transmission electron microscopes. On the objective end, a shielding ring 13 extends from base body 11 and coaxially surrounds the objective end opening 11a. The shielding ring 13 substantially closes the intermediate space between the exit end of the objective lens 9 and the specimen. The shielding ring 13 can be configured as a metal bellows so that, even for a tipped specimen table, no intermediate space occurs between the objective lens and the base body 11.

A diaphragm holder 15 extends from the base body 11 on the side facing away from the objective 9. The diaphragm holder 15 has a diaphragm accommodated therein having several diaphragm openings (19, 20, 21). The position of the diaphragm openings relative to the optical axis OA is adjustable via piezo drives in both directions perpendicular to the optical axis OA. Furthermore, the diaphragms can be switched motorically, that is, each of the three diaphragm openings can be selectively switched into a position so that the diaphragm opening lies on the optical axis OA. The motoric drive for the diaphragm switching and for the adjustment of the diaphragms is indicated in FIG. 1 by reference numeral 18. The drives for the specimen table 16 are indicated in FIG. 1 by reference numeral 17.

At least one diaphragm 20 of the diaphragms (19, 20, 21) has a central region which is impermeable for electrons for a dark-field contrast, that is, the diaphragm has an annular shape.

Furthermore, a prism-shaped conversion element 22 is accommodated on the specimen table 16. The conversion element 22 comprises a material of a high order number, for example, copper, brass or gold and has the characteristic that it emits, when impinged with electrons, more electrons than are incident thereon. The emitted electrons are represented by arrow 27 in FIG. 1.

Furthermore, an electron detector is mounted in the specimen chamber 2 and, in the illustrated embodiment, the detector is configured as an Everhard-Thornley detector. This detector includes an acceleration electrode 23 and a glass rod 25 provided with a scintillator 24.

With the above-described arrangement, the electrons, which exit from the electron source, are focused by the objective 9 on a specimen which is to be accommodated on the specimen holder 12. The shielding ring 13 ensures that no electrons (back-scattered electrons or secondary electrons), which exit from the specimen on the objective end, can reach the detector (23, 24, 25).

With the diaphragm at the lower end of the base body 11, which faces away from the objective, it is ensured that only such electrons contribute to the image generation which have passed the diaphragm opening (19, 20, 21) switched into the beam path. If the diaphragm 20 having the central region impermeable for electrons is switched in, the consequence is that only such electrons impinge on the conversion element through this diaphragm which were scattered at the specimen at a corresponding angle. All remaining electrons, which were scattered at an angle which is too small or at an angle which is too large, are absorbed either by the wall of the base body 11 or by the impermeable region of the diaphragm. The bellied configuration of the base body therefore serves also as a ray trap for electrons scattered too intensely at the specimen.

The electrons, which have passed the switched-in diaphragm, are slightly amplified by the conversion element via a secondary electron emission and, thereafter, electrons which exit from the conversion element are detected by the detector (23, 24, 25). For generating a complete image of the specimen, the primary electron beam is scanned over the probe sequentially with the aid of the deflection system 10 and, in each case, a particular signal is detected by the detector in synchronism with the scanning and the total image is so successively built up. The diaphragm is held spatially fixed during this scanning of the primary electron beam. In order to also detect larger specimen fields, the specimen can be displaced by shifting the specimen table each time after a partial image is recorded and, simultaneously, the diaphragm can be displaced in the opposite direction relative to the base body 11.

Depending upon selection and adjustment of the diaphragm switched into the beam path, different contrastings can be generated, especially a dark-field contrast when the diaphragm having the central region impermeable for electrons is switched into the beam path.

Figure 2:
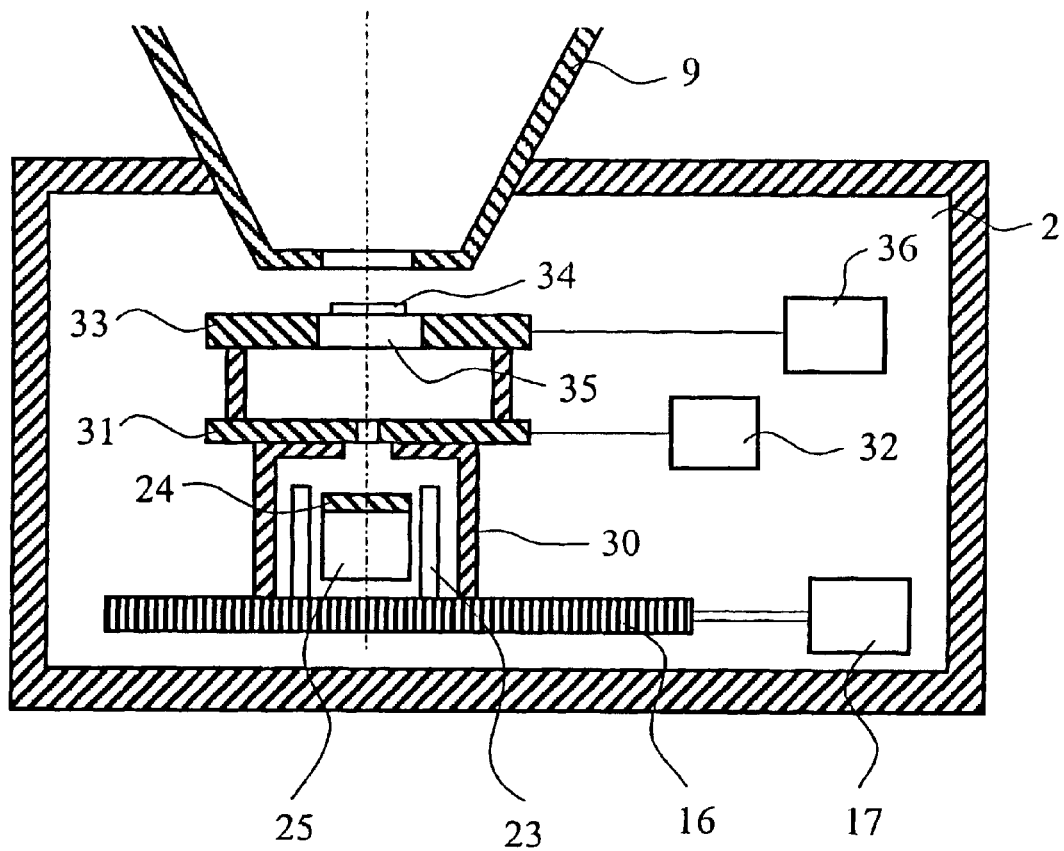
FIG. 2 is a schematic of an alternate embodiment of the invention also in section; and, FIG. 3 is a schematic, in section, of a raster electron microscope according to the invention having an energy filter.

The embodiment of FIG. 2 corresponds to the embodiment of FIG. 1 with respect to the raster electron microscope. For this reason, reference is made to the above description of FIG. 1.

In the alternative embodiment, the detector is accommodated directly on the SEM specimen table 16 and can again be configured as a scintillation detector (23, 24, 25). The detector is surrounded by a cylindrical shielding unit 30 having an objective-end inlet opening. The diaphragm holder 31 contains several diaphragms with different openings and closes the inlet opening of the shielding unit. In contrast to the embodiment of FIG. 1, the diaphragm holder 31 in this embodiment is not adjustable but only switchable so that one of the diaphragm openings can be switched into the center switch position. In this way, the diaphragm opening lies above the opening in the shielding unit. The adjustment of the diaphragm relative to the optical axis of the electron microscope takes place via the drives of the specimen table 16.

The specimen holder 33 is accommodated on the objective end of the diaphragm holder and is adjustable relative to the remaining components and especially to the diaphragm holder. The specimen holder 33 can be adjusted relative to the diaphragm holder perpendicularly to the optical axis OA via piezo drives 36. The generation of the desired contrast takes place in this embodiment via an adjustment of the specimen relative to the diaphragm.

An improved signal-to-noise ratio is realized in this second embodiment because of the use of the scintillation detector.

Figure 3:
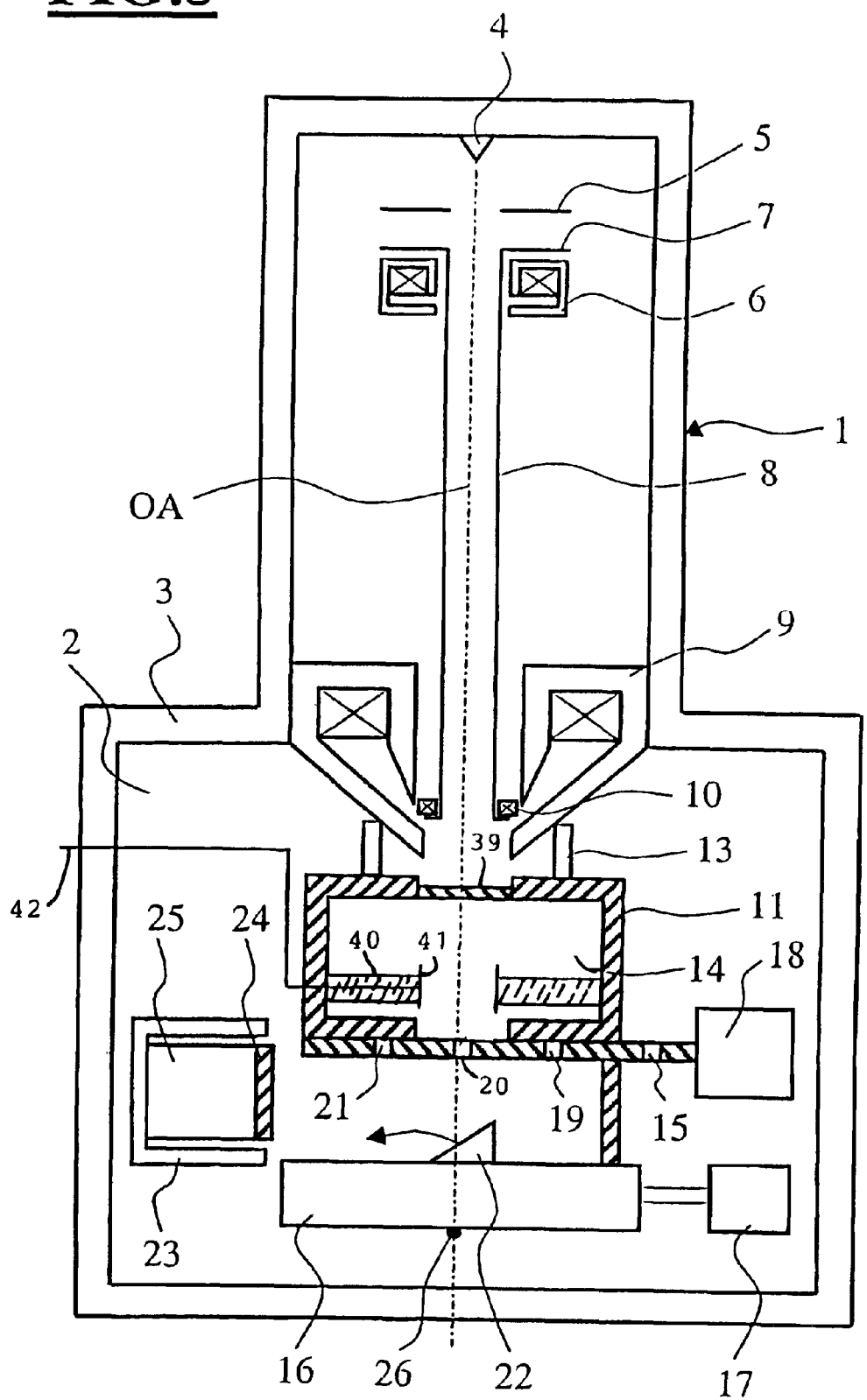

In FIG. 3, the components, which correspond to the components of the embodiment of FIG. 1, are identified by the same reference numerals. In addition to the components described with reference to the embodiment of FIG. 1, the ancillary unit includes an energy filter mounted between the specimen holder 39 and the diaphragm holder 15 having the diaphragm openings (19, 20, 21). The ancillary unit is mounted in the specimen chamber 2 having the specimen chamber housing 3. The energy filter, which is realized in this embodiment, includes a cylindrical electrode 41, which is accommodated coaxially to the base body 11 in the interior thereof on an insulator 40. A negative potential relative to the potential of the base body 11 can be applied to the cylindrical electrode 41 by means of a high voltage source (not shown) via a line 42. This negative potential brakes the electrons transmitted through the specimen. In this way, only such electrons whose kinetic energy is higher than the energy defined by the potential of the cylindrical electrode, reach diaphragm openings (19, 20, 21) and can pass therethrough. In this way, for example, only such electrons contribute, to the signal generation which, when passing through the specimen, experience no energy loss or only such an energy loss which is less than the maximum energy loss defined by the potential of electrode 41. The maximum potential, which can be applied to the cylindrical electrode 41, should therefore correspond to the inverse anode, potential of the electron microscope. If a more precise adjustment of the energy is required, a direct-vision magnetic or electrostatic spectrometer or energy filter can be used in lieu of a simple counter-field lens which is formed by the cylindrical electrode 41 to which potential is applied. An energy filter of this kind is described, for example, in U.S. Pat. No. 6,384,412 incorporated herein by reference. If required, the energy filter can have an inlet diaphragm, that is, on the side facing toward the specimen holder 39.

Alternatively to the described arrangement of the energy filter between the specimen holder 39 and the diaphragm holder 15 in the interior of the base body 11, the energy filter can also be mounted between the diaphragm holder 15 and the specimen table 16, that is, viewed in the direction of the propagation of the electrodes rearward of the diaphragm opening (19, 20, 21) if, in this way, the path of the electrons to the detector is not blocked as is the case in the embodiment of FIG. 2. This can, for example, be realized when, in the embodiment of FIG. 2, a counter field electrode is mounted within the base body 30 between the diaphragm holder 31 and the detector (23, 24, 25). The counter field electrode lies at a negative potential relative to the potential of the base body 30.

In the described embodiments, only a single specimen holder is provided in each case. It is also possible to arrange several specimen holders on a carrier which can be rotated about the axis like a carousel or turret so that several specimens can be analyzed sequentially in that one specimen holder after the other is positioned above one of the diaphragm openings (19, 20, 21). The axis is parallel to the optical axis of the electron microscope and offset.

It is understood that the foregoing description is that of the preferred embodiments of the invention and that various changes and modifications may be made thereto without departing from the spirit and scope of the invention as defined in the appended claims.

What is claimed is:

1. A raster electron microscope comprising:
    an electron source for emitting electrons along a beam path toward a specimen;
    a specimen chamber mounted in said beam path;
    a detector mounted in said specimen chamber for detecting electrons;
    a specimen table mounted in said specimen chamber and having a specimen holder;
    a diaphragm system mounted on said specimen table and said diaphragm system being adjustable relative to said specimen holder; and,
    said diaphragm system including a diaphragm arranged between said specimen holder and said detector.

2. The raster electron microscope of claim 1, further comprising a base body; a shielding unit extending from said base body and said specimen holder being mounted in said shielding unit; and, said diaphragm system being mounted on a side of said base body facing away from said specimen holder.

3. The raster electron microscope of claim 2, wherein said shielding unit is a cylindrical tube impermeable to electrons.

4. The raster electron microscope of claim 1, wherein said detector is configured for the detection of secondary electrons.

5. The raster electron microscope of claim 1, wherein said detector is configured for the detection of electrons of an energy corresponding approximately to the primary electron energy.

6. The raster electron microscope of claim 4, wherein said detector includes a conversion element which, when irradiated with electrons, emits secondary electrons having a yield greater than 1.

7. The raster electron microscope of claim 1, wherein said diaphragm system includes several diaphragms having different diaphragm openings; and, said diaphragms are selectively introducible between said specimen holder and said detector.

8. The raster electron microscope of claim 1, wherein said diaphragms or one of said diaphragms has a central region impermeable for electrons.

9. The raster electron microscope of claim 1, wherein said specimen table can be tilted about an axis perpendicular to the optical axis of said raster electron microscope.

10. The raster electron microscope of claim 1, further comprising an energy filter mounted between said specimen holder and said detector.

11. The raster electron microscope of claim 10, wherein said energy filter is configured as an electrode to which a negative potential can be applied.

12. An ancillary unit for a raster electron microscope having a specimen table, the ancillary unit comprising:
    a cylindrical shielding unit accommodated on said specimen table;
    a specimen holder mounted in the interior of said shielding unit;
    a diaphragm holder adjustable relative to said specimen holder and said diaphragm holder having a plurality of diaphragms arranged thereon;
    one of said diaphragms having an annular configuration with a central region impermeable for electrons;
    said shielding unit having a side facing toward said specimen table; and,
    said diaphragm holder closing off said shielding unit on said side thereof.

13. An ancillary unit for a raster electron microscope having a specimen table, the ancillary unit comprising:
    a cylindrical shielding unit accommodated on said specimen table;
    a detector mounted in the interior of said shielding unit;
    said shielding unit having an opening;
    a diaphragm holder having a plurality of diaphragms arranged thereon and one of said diaphragms having an annular configuration with a central region impermeable for electrons; and
    a specimen holder adjustable relative to said shielding unit or any one of said diaphragm and perpendicularly to the optical axis.

14. The ancillary unit of claim 13, further comprising an energy filter arranged between said specimen holder and said diaphragm holder.

15. The ancillary unit of claim 12, further comprising an energy filter arranged between said specimen holder and said diaphragm holder.

16. A raster electron microscope defining an optical axis and comprising:
    an electron source for emitting electrons along a beam path toward a specimen;
    an objective lens for generating an electron focus;
    said objective lens being mounted downstream of said electron source and including a deflection system for deflecting said electron focus perpendicularly to said optical axis for scanning said specimen;
    a specimen chamber mounted in said beam path;
    a detector mounted in said specimen chamber for detecting electrons;
    a specimen table mounted in said specimen chamber and having a specimen holder;
    a diaphragm system mounted on said specimen table and said diaphragm system being adjustable relative to said specimen holder; and,
    said diaphragm system including a diaphragm arranged between said specimen holder and said detector.

17. The raster electron microscope of claim 16, further comprising a base body; a shielding unit extending from said base body and said specimen holder being mounted in said shielding unit; and, said diaphragm system being mounted on a side of said base body facing away from said specimen holder.

18. The raster electron microscope of claim 17, wherein said shielding unit is a cylindrical tube impermeable to electrons.

19. The raster electron microscope of claim 16, wherein said detector is configured for the detection of secondary electrons.

20. The raster electron microscope of claim 16, wherein said detector is configured for the detection of electrons of an energy corresponding approximately to the primary electron energy.

21. The raster electron microscope of claim 19, wherein said detector includes a conversion element which, when irradiated with electrons, emits secondary electrons having a yield greater than 1.

22. The raster electron microscope of claim 16, wherein said diaphragm system includes several diaphragms having different diaphragm openings; and, said diaphragms are selectively introducible between said specimen holder and said detector.

23. The raster electron microscope of claim 16, wherein said diaphragms or one of said diaphragms has a central region impermeable for electrons.

24. The raster electron microscope of claim 16, wherein said specimen table can be tilted about an axis perpendicular to the optical axis of said raster electron microscope.

25. The raster electron microscope of claim 16, further comprising an energy filter mounted between said specimen holder and said detector.

26. The raster electron microscope of claim 25, wherein said energy filter is configured as an electrode to which a negative potential can be applied.

27. A raster electron microscope defining an optical axis and comprising:
- an electron source for emitting electrons along a beam path toward a specimen;
- a specimen chamber mounted in said beam path;
- a detector mounted in said specimen chamber for detecting electrons;
- a specimen table mounted in said specimen chamber and having a specimen holder;
- a diaphragm system mounted on said specimen table and said diaphragm system being adjustable relative to said specimen holder;
- said diaphragm system including a diaphragm arranged between said specimen holder and said detector; and,
- a device for adjusting said diaphragm system in two directions perpendicular to said optical axis.

28. The raster electron microscope of claim 27, further comprising a base body; a shielding unit extending from said base body and said specimen holder being mounted in said shielding unit; and, said diaphragm system being mounted on a side of said base body facing away from said specimen holder.

29. The raster electron microscope of claim 28, wherein said shielding unit is a cylindrical tube impermeable to electrons.

30. The raster electron microscope of claim 27, wherein said detector is configured for the detection of secondary electrons.

31. The raster electron microscope of claim 27, wherein said detector is configured for the detection of electrons of an energy corresponding approximately to the primary electron energy.

32. The raster electron microscope of claim 30, wherein said detector includes a conversion element which, when irradiated with electrons, emits secondary electrons having a yield greater than 1.

33. The raster electron microscope of claim 27, wherein said diaphragm system includes several diaphragms having different diaphragm openings; and, said diaphragms are selectively introducible between said specimen holder and said detector.

34. The raster electron microscope of claim 27, wherein said diaphragms or one of said diaphragms has a central region impermeable for electrons.

35. The raster electron microscope of claim 27, wherein said specimen table can be tilted about an axis perpendicular to the optical axis of said raster electron microscope.

36. The raster electron microscope of claim 27, further comprising an energy filter mounted between said specimen holder and said detector.

37. The raster electron microscope of claim 36, wherein said energy filter is configured as an electrode to which a negative potential can be applied.

38. A raster electron microscope comprising:
- an electron source for emitting electrons along a beam path toward a specimen;
- a specimen chamber mounted in said beam path;
- a detector mounted in said specimen chamber for detecting electrons;
- a specimen table mounted in said specimen chamber and having a specimen holder;
- a diaphragm system mounted on said specimen table and said diaphragm system being adjustable relative to said specimen holder;
- said diaphragm system including a diaphragm arranged between said specimen holder and said detector;
- said diaphragm system including several diaphragms having different diaphragm openings;
- said diaphragms being selectively introducible between said specimen holder and said detector; and
- said diaphragms or one of said diaphragms having a central region impermeable for electrons.

39. The raster electron microscope of claim 38, further comprising a base body; a shielding unit extending from said base body and said specimen holder being mounted in said shielding unit; and, said diaphragm system being mounted on a side of said base body facing away from said specimen holder.

40. The raster electron microscope of claim 39, wherein said shielding unit is a cylindrical tube impermeable to electrons.

41. The raster electron microscope of claim 38, wherein said detector is configured for the detection of secondary electrons.

42. The raster electron microscope of claim 38, wherein said detector is configured for the detection of electrons of an energy corresponding approximately to the primary electron energy.

43. The raster electron microscope of claim 41, wherein said detector includes a conversion element which, when irradiated with electrons, emits secondary electrons having a yield greater than 1.

44. The raster electron microscope of claim 38, wherein said specimen table can be tilted about an axis perpendicular to the optical axis of said raster electron microscope.

45. The raster electron microscope of claim 38, further comprising an energy filter mounted between said specimen holder and said detector.

46. The raster electron microscope of claim 45, wherein said energy filter is configured as an electrode to which a negative potential can be applied.

* * * * *

UNITED STATES PATENT AND TRADEMARK OFFICE
CERTIFICATE OF CORRECTION

PATENT NO. : 6,815,678 B2
DATED : November 9, 2004
INVENTOR(S) : Ute Golla-Schindler and Bernd Schindler It is certified that error appears in the above-identified patent and that said Letters Patent is hereby corrected as shown below:

Title page,
Item [75], Inventors, delete "Galen" and substitute -- Aalen -- for both inventors.
Item [73], Assignee, delete "Elektronemikroskopie" and substitute
-- Elektronenmikroskopie -- therefor.

Column 2,
Line 49, delete "regions," and substitute -- region, -- therefor.
Line 50, delete "objective" and substitute -- objective, -- therefor.
Line 52, delete "exits" and substitute -- exit -- therefor.

Column 4,
Line 24, delete "SEN" and substitute -- SEM -- therefor.
Line 25, delete "an" and substitute -- in -- therefor.

Column 6,
Line 35, insert -- the -- before "diaphragm".
Line 37, delete "contribute," and substitute -- contribute -- therefor.
Line 43, delete "anode," and substitute -- anode -- therefor.

Column 8,
Line 22, delete "diaphragm" and substitute -- diaphragms -- therefor.

Signed and Sealed this

Twenty-second Day of February, 2005

JON W. DUDAS
*Director of the United States Patent and Trademark Office*